United States Patent
Vashchenko et al.

(10) Patent No.: US 8,497,167 B1
(45) Date of Patent: Jul. 30, 2013

(54) EDS PROTECTION DIODE WITH PWELL-NWELL RESURF

(75) Inventors: Vladislav Vashchenko, Palo Alto, CA (US); Vladimir Kuznetsov, Santa Clara, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 537 days.

(21) Appl. No.: 11/654,736

(22) Filed: Jan. 17, 2007

(51) Int. Cl.
*H01L 31/107* (2006.01)
*H01L 23/60* (2006.01)

(52) U.S. Cl.
USPC ......... 438/140; 438/202; 257/487; 257/492; 257/494; 257/603; 257/E21.355

(58) Field of Classification Search
USPC .......... 257/458, 656, E33.046, E29.336, 257/E31.036, E31.087–E31.088, E31.061–E31.062, 335, E21.427, E21.446, 257/E21.544, E21.625, E21.628, E21.63, 257/E21.696, E27.015, E27.06, E27.069, 257/E29.008, E29.027, E29.04, E29.054, 257/E29.055, E29.063, E29.064, E29.133, 257/E29.146, E29.156, E29.268, E29.312, 257/E29.335, E29.345, 168, 487–496, 603, 257/E21.355–E21.357; 438/141, 140, 202–205, 438/208

See application file for complete search history.

(56) References Cited

U.S. PATENT DOCUMENTS

| | | | | |
|---|---|---|---|---|
| 4,411,058 A * | 10/1983 | Chen | 438/218 |
| 5,024,961 A * | 6/1991 | Lee et al. | 438/443 |
| 5,071,777 A * | 12/1991 | Gahle | 438/443 |
| 5,374,838 A * | 12/1994 | Sawada et al. | 257/369 |
| 5,393,677 A * | 2/1995 | Lien et al. | 438/207 |
| 5,650,658 A * | 7/1997 | Beasom | 257/409 |
| 5,661,067 A * | 8/1997 | Lee et al. | 438/420 |
| 5,707,886 A * | 1/1998 | Consiglio et al. | 438/200 |
| 5,786,617 A * | 7/1998 | Merrill et al. | 257/371 |
| 5,843,813 A * | 12/1998 | Wei et al. | 438/200 |
| 5,856,214 A * | 1/1999 | Yu | 438/133 |
| 5,963,799 A * | 10/1999 | Wu | 438/199 |
| 6,103,562 A * | 8/2000 | Son et al. | 438/217 |
| 6,146,951 A * | 11/2000 | Choi | 438/281 |
| 6,300,209 B1 * | 10/2001 | Oh | 438/370 |
| 6,306,700 B1 * | 10/2001 | Yang | 438/217 |
| 6,462,385 B1 * | 10/2002 | Kumagai | 257/372 |
| 6,545,303 B1 * | 4/2003 | Scheffer | 257/290 |
| 6,639,284 B1 * | 10/2003 | Chatterjee et al. | 257/355 |
| 6,706,567 B2 * | 3/2004 | Hwang | 438/140 |
| 6,869,840 B2 * | 3/2005 | Chatterjee et al. | 438/238 |
| 6,909,149 B2 * | 6/2005 | Russ et al. | 257/355 |
| 6,933,488 B2 * | 8/2005 | Pain | 250/214.1 |
| 7,005,354 B2 * | 2/2006 | Pan et al. | 438/286 |
| 7,176,532 B2 * | 2/2007 | Dosluoglu | 257/369 |
| 7,297,590 B2 * | 11/2007 | Muller et al. | 438/237 |
| 7,482,218 B1 * | 1/2009 | McCollum et al. | 438/223 |
| 7,514,332 B2 * | 4/2009 | Tanaka | 438/305 |
| 2002/0024102 A1 * | 2/2002 | Lee et al. | 257/369 |

(Continued)

*Primary Examiner* — Matthew Landau
*Assistant Examiner* — Maliheh Malek
(74) *Attorney, Agent, or Firm* — Eugene C. Conser; Wade J. Brady, III; Frederick J. Telecky, Jr.

(57) ABSTRACT

A high voltage ESD protection diode wherein the p-n junction is defined by a p-well and an n-well and includes a RESURF region, the diode including a field oxide layer formed on top of the p-well and n-well, wherein the parameters of the diode are adjustable by controlling one or more of the junction width, the length of the RESURF region, or the length of the field oxide layer.

8 Claims, 2 Drawing Sheets

U.S. PATENT DOCUMENTS

| | | | |
|---|---|---|---|
| 2002/0130336 A1* | 9/2002 | Heineke et al. | 257/257 |
| 2004/0080883 A1* | 4/2004 | Chatterjee et al. | 361/56 |
| 2005/0042815 A1* | 2/2005 | Williams et al. | 438/202 |
| 2005/0151160 A1* | 7/2005 | Salcedo et al. | 257/173 |
| 2006/0017072 A1* | 1/2006 | Dosluoglu | 257/218 |
| 2006/0157818 A1* | 7/2006 | Williams et al. | 257/511 |
| 2007/0007545 A1* | 1/2007 | Salcedo et al. | 257/127 |
| 2007/0278573 A1* | 12/2007 | Knaipp | 257/344 |
| 2008/0061367 A1* | 3/2008 | Williams et al. | 257/336 |
| 2008/0061377 A1* | 3/2008 | Williams et al. | 257/371 |
| 2008/0061400 A1* | 3/2008 | Williams et al. | 257/546 |
| 2008/0067585 A1* | 3/2008 | Williams et al. | 257/330 |
| 2008/0067586 A1* | 3/2008 | Williams et al. | 257/335 |
| 2008/0116480 A1* | 5/2008 | Glenn et al. | 257/168 |
| 2008/0233686 A1* | 9/2008 | Lee et al. | 438/133 |
| 2009/0020818 A1* | 1/2009 | Voldman | 257/357 |
| 2009/0034137 A1* | 2/2009 | Disney et al. | 361/56 |
| 2009/0261378 A1* | 10/2009 | Salcedo et al. | 257/127 |
| 2010/0032769 A1* | 2/2010 | Hao et al. | 257/378 |
| 2010/0173458 A1* | 7/2010 | You et al. | 438/200 |
| 2010/0267212 A1* | 10/2010 | Morris | 438/275 |
| 2010/0317165 A1* | 12/2010 | Kim | 438/207 |

* cited by examiner

ESD PROTECTION DIODE WITH PWELL-NWELL RESURF

FIELD OF THE INVENTION

The invention relates to an ESD protection device for high voltage applications. In particular, it relates to an ESD protection device for high voltage switching regulators that is implemented in a high voltage BiCMOS process.

BACKGROUND OF THE INVENTION

In the case of ESD protection devices having a control gate, operation mode typically involves either normal mode, wherein the control gate is controlled by a bias voltage to define an active clamp, or snapback mode based on punch-through effect, which occurs when the forward blocking voltage is reached.

Apart from these control gate devices, some ESD protection solutions make use of Zener diodes, which operate in avalanche breakdown mode.

However the use of Zener diodes becomes problematic when dealing with ESD protection of high voltage, fast switching devices such as fast switching voltage regulators, which during normal operation display switching times in the range of 10 ns-200 ps. Thus they can have switching times that are faster than the ESD rise time (10 ns for HBM pulse).

Not only is it difficult to provide a high voltage Zener diode that is suited for such high voltage node ESD protection, they rely on passive switching due to a triggering voltage that exceeds the forward blocking voltage. Thus it is difficult to provide a Zener diode with the desired breakdown characteristics and which avoids being triggered under normal high speed, high voltage operation.

The present invention seeks to provide a diode ESD protection solution for high voltage, high speed applications.

SUMMARY OF THE INVENTION

According to the invention there is provided a diode defining a p-n junction, the diode comprising a p+ region formed in a p-well, an n+ region formed in an n-well, the p-well and n-well being formed in an n-material that has a lower dopant concentration than the n-well or in a p-material that has a lower dopant concentration than the p-well, wherein the p-n junction includes a low doped region. The diode may further comprise an oxide layer formed on top of the p-well and n-well. The n-material or p-material in which the n-well an p-well are formed may comprise an epitaxial layer. The n-well and p-well may be spaced apart (typically by 0.5 um or less) so that the low doped region of the p-n junction is defined by part of the epitaxial layer. The n-well and p-well may instead overlap so that the low doped region of the p-n junction is defined by virtue of counter-doping.

Further, according to the invention, there is provided a method of increasing the breakdown voltage of a diode, comprising forming a p-n junction by forming a p-well and an n-well in a low doped material, and forming a low doped region between the n-well and p-well. The low doped region may be formed by separating the n-well and p-well, or by overlapping the n-well and p-well. The method may include forming an oxide layer on top of the n-well and p-well.

Still further, according to the invention, there is provided a method of controlling the parameters of a diode, comprising forming a p-n junction by forming a p-well and an n-well in a low doped material, forming a low doped region between the n-well and p-well, and adjusting the length of the low doped region. The low doped region may be formed by separating the n-well and p-well, or by overlapping the n-well and p-well. The method may include forming an oxide layer on top of the n-well and p-well and adjusting the length of the oxide layer. The method may also include varying the p-n junction length and operating the diode either in avalanche breakdown mode or dual avalanche breakdown mode (conductivity remodulation regime)

DETAILED DESCRIPTION OF THE INVENTION

One type of diode, referred to as a PIN (P+ material-Insulator-N+ material) diode makes use of two avalanche multiplication regions. At a high enough current density one avalanche multiplication region forms near the n+/Insulator junction and one forms near the p+/Insulator junction. The two avalanche regions result in space charge neutralization of the injected carriers, which provides a positive feedback that produces an S-shaped I-V characteristic. This dual avalanche breakdown effect will also be referred to in this application as the conductivity remodulation regime.

The advantage of a PIN diode over a Zener is that it produces almost vertical I-V characteristics, which are useful when dealing with high voltage, high speed applications as is the case with ESD protection of switching regulators. Furthermore, since the double avalanche multiplication of the PIN diode is avalanche based it does not have dV/dt side effects such as those found in NPN BJT or SCR devices.

However the implementation of such PIN diodes presents a challenge in a non-self-aligned process.

The present invention provides for a new type of diode that can be implemented in a high voltage BiCMOS process. The diode of the present invention includes a p+ region and an n+ region separated by a low doped or diluted or RESURF (reduced surface electric field) region.

Figure 1:
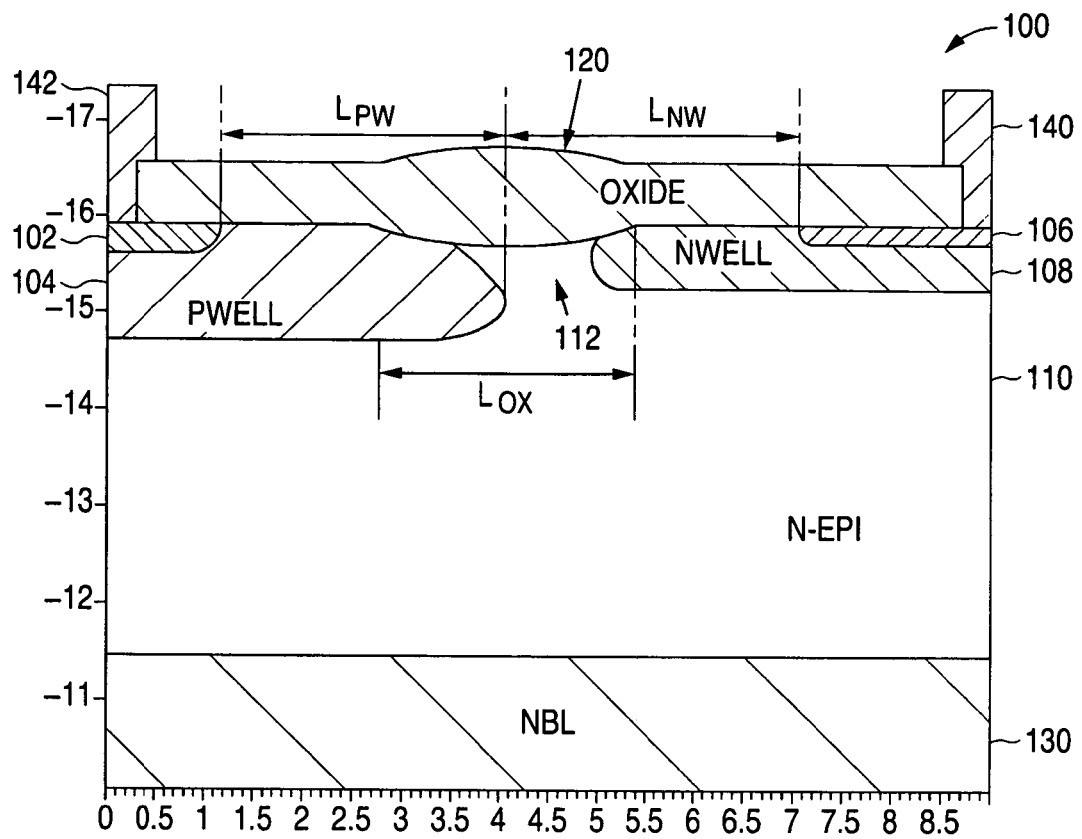
FIG. 1 is a sectional view through one embodiment of an ESD protection structure of the invention.

One embodiment of the invention is shown in FIG. 1, which shows a cross-section of an ESD structure in accordance with the invention. The structure 100 has a p+ region 102 formed in a p-well 104, and an n+ region 106 formed in an n-well 108. The p-well 104 and n-well 108 are formed in an epitaxial layer 110 which is formed according to one embodiment of the invention to extend between the p-well 104 and n-well 108. As shown in FIG. 1, an n-buried layer (NBL) 130 is formed beneath the n-epi 110. Since the epi region 110 has a lower dopant concentration than the n-well 108 it forms a low doped or diluted or RESURF region 112 between the p-well 104 and n-well 108. This resultant diluted p-n junction provides for a high breakdown voltage. Also, as is discussed in greater detail below, the p-well/n-well separation can be adjusted to adjust this breakdown voltage, thereby allowing the desired breakdown voltage to be achieved.

As shown in FIG. 1, the device 100 further includes a field oxide 120, which serves to avoid surface breakdown. Tests have shown that by adjusting the separation between the p-well 104 and n-well 108, and by adjusting the length of the filed oxide (LOX) the holding voltage can be adjusted to be only a few volts higher than the breakdown voltage. This is best illustrated by the I-V curves of FIGS. 2 to 4.

Figure 2:
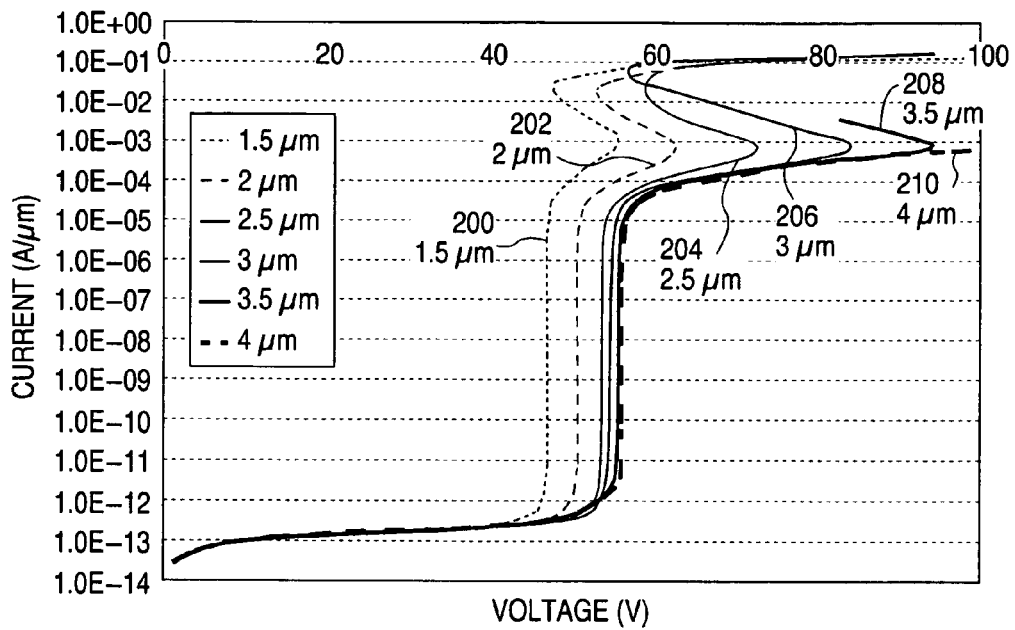
FIG. 2 shows I-V curves for different embodiments of the invention.

FIG. 2 shows current density against voltage across the device for a p-well/n-well separation of 0.25 um.

As shown in FIG. 2, as the field oxide length (LOX) increases for a given p-well/n-well separation (in this example a p-well/n-well separation of 0.25 um), the breakdown voltage VBR increases from 47 V for LOX of 1.5 um to 56 V for a LOX of 4. The snapback voltage also increases from 52 V for LOX of 1.5 um to more than 100 V for a LOX of 4. Also, the holding voltage increases from 50 V for LOX of 1.5 um to 66 V for a LOX of 4. In fact, it was found that diodes with a gate oxide length (LOX) in the range of 2-3 um had a holding voltage that was only 5-9 V higher than the breakdown voltage. As shown in FIG. 2, curve 200 shows the curve for a LOX of 1.5 um, curve 202 shows the curve for a LOX of 2 um, curve 204 shows the curve for a LOX of 2.5 um, curve 206 shows the curve for a LOX of 3 um, curve 208 shows the curve for a LOX of 3.5 um, curve 210 shows the curve for a LOX of 4 um.

As mentioned above, the diode of the present invention can be operated in the conductivity remodulation regime. This is of particularly importance when the device has to be small. This allows a p-well to n-well junction width of 100 um to be achieved while providing for operating current levels of 2-3 A. In the conductivity remodulation regime, once maximum avalanche current is reached in the low doped region between the p-well and the n-well, the peak of the electric field shifts from the center of this low doped region to the junction between the p+ region 102 and the p-well 104, and to the junction between the n+ region 106 and the n-well 108. This increases the conductivity of the low doped region and of the diode overall, which accounts for the near vertical I-V characteristic shown in FIG. 3.

Figure 3:
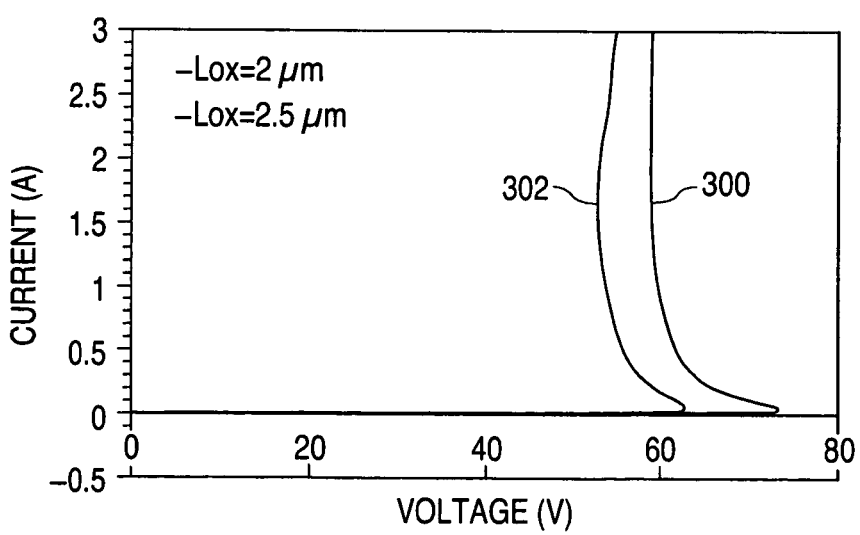
FIG. 3 shows I-V curves for two different embodiments of the invention operating in avalanche breakdown mode.

FIG. 3 shows the I-V characteristics for a diode of the invention with a p-n junction of 100 um, operating in the conductivity remodulation regime. It also shows the effect of changing the field oxide length from 2 um to 2.5 um. Curve 300, which shows the I-V curve for a LOX of 2.5 um has a breakdown voltage of about 73 V compared to a breakdown voltage of only 63V at a LOX of 2 um (curve 302).

Figure 4:
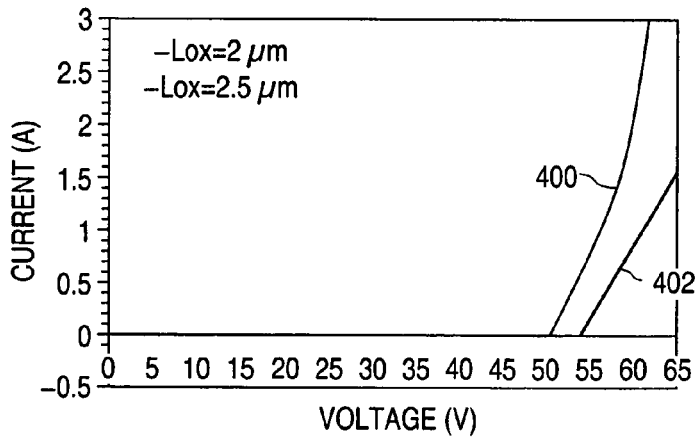
FIG. 4 shows I-V curves for two different embodiments of the invention operating in conductivity remodulation mode.

While the above discussion dealt with the conductivity remodulation regime in which there is a dual avalanche breakdown, the diode of the invention can instead be operated in normal avalanche breakdown regime, like a Zener diode. This has the advantage that the operating characteristics are very stable and the device is easy to implement since it is based on p-n junction breakdown. However, in avalanche mode the resistance is very large, therefore to accommodate the ESD current levels of 2 A the width of the device has to be significantly larger than in the case of the conductivity remodulation regime. In particular, in one embodiment a p-n junction width of 10 mm was used. The I-V characteristics for this embodiment are shown in FIG. 4, which shows the less steep I-V characteristics of the single avalanche breakdown. Again the breakdown voltage increases as the LOX increases from 2 um (curve 400) to 2.5 um (curve 402). However, the breakdown voltage is lower for both than for the conductivity remodulation regime shown in FIG. 3. Also the impact of increasing the LOX is less significant. As shown in FIG. 4, at a LOX of 2 um the avalanche breakdown occurs at about 50 V, while at a LOX of 2.5 um the breakdown occurs at about 54V. In the embodiment discussed with respect to FIG. 1, the low doped or RESURF region was formed by separating the p-well from the n-well using an n-epi region having a lower doping level than the n-well.

Figure 5:
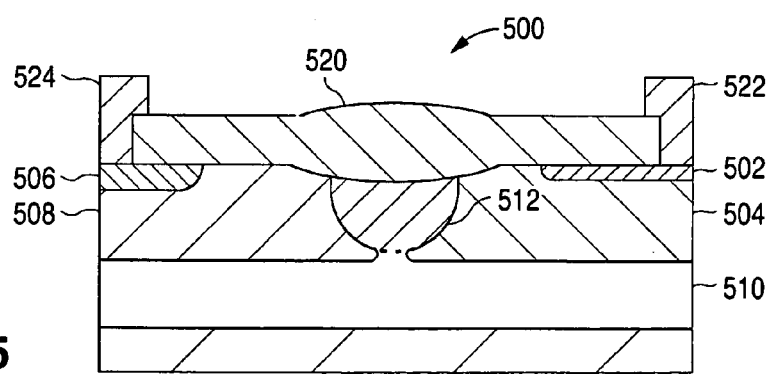
FIG. 5 is a sectional view through another embodiment of an ESD protection structure of the invention.

In the embodiments discussed above, the low doped regions are formed by spacing the p-well and n-well apart in a lower doped epi material. In another embodiment the low doped region is formed by overlapping the p-well and n-well, which has the effect of reducing the doping level in the overlap region due to counter doping. Such an embodiment is shown in FIG. 5. In this embodiment, the device 500 includes a p+ region 502 formed in a p-well 504, and an n+ region 506 formed in an n-well 508. The p-well 504 and n-well 508 are formed in an n-epitaxial layer 510 and overlap in the region indicated by reference numeral 512 to form a low doped region. While in this embodiment the p-well 504 and n-well 508 were formed in an n-epi layer, it will be appreciated that the wells could instead be formed in a p-epi layer or in an n-substrate or p-substrate. As in device 100, a field oxide 520 is formed between polysilicon regions 522, 524. The operation of the device 500 remains similar to that of device 100. Thus the LOX and spacing between p-well 104 and n-well 108 can again be adjusted to control the breakdown voltage and, in the case of conductivity remodulation regime, also the snapback and holding voltage.

It will be appreciated that while specific embodiments were discussed for implementing the diode of the invention, these were by way of example only and other embodiments could be implemented without departing from the scope of the invention.

What is claimed is:

1. A method of increasing the breakdown voltage of a diode comprising:
   forming a p-n junction by forming a p-well and an n-well in a low doped material;
   wherein the p-well partially overlaps the n-well forming a reduced doping level in an overlap region due to counterdoping;
   forming a p+ contact region in the p-well and an n+ contact region in the n-well, wherein no other n+ regions or p+ regions are formed in the overlap region;
   forming a field oxide layer extending over the lower doped overlap region, wherein the field oxide layer prevents surface breakdown; and
   also wherein no other n+ regions or p+ regions are formed between the p+ contact region in the p-well and the n+ contact region in the n-well.

2. A method of forming a diode with controllable breakdown voltage parameters, comprising;
   forming a p-n junction by forming a p-well and an n-well in a low doped material;
   wherein the p-well partially overlaps the n-well forming a reduced doping level in an overlap region due to counterdoping;
   forming a p+ contact region in the p-well and an n+ contact region in the n-well, wherein no other n+ regions or p+ regions are formed in the overlap region;
   forming a field oxide layer extending over the lower doped overlap region, wherein the field oxide layer prevents surface breakdown; and
   also wherein no other n+ regions or p+ regions are formed between the p+ contact region in the p-well and the n+ contact region in the n-well.

3. A method of claim 2, further comprising adjusting the length of the low doped overlap region.

4. A method of claim 2, further comprising varying the p-n junction length and operating the diode in avalanche breakdown mode.

5. A method of claim 2, further comprising varying the p-n junction length and operating the diode in dual avalanche breakdown mode (conductivity remodulation regime).

6. A method of claim 3, further comprising varying the p-n junction length and operating the diode in avalanche breakdown mode.

7. A method of claim 3, further comprising varying the p-n junction length and operating the diode in dual avalanche breakdown mode (conductivity remodulation regime).

8. A method of claim 2, further comprising adjusting the length of the overlap region between the p-well and the n-well, and adjusting the length of the field oxide layer.

* * * * *